United States Patent
Wang et al.

(10) Patent No.: US 12,082,476 B2
(45) Date of Patent: Sep. 3, 2024

(54) IRREGULARLY-SHAPED DISPLAY PANEL AND DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventors: Yijia Wang, Hubei (CN); Ming Zhang, Hubei (CN); Ao Wang, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/593,979

(22) PCT Filed: Aug. 6, 2021

(86) PCT No.: PCT/CN2021/111222
§ 371 (c)(1),
(2) Date: Sep. 29, 2021

(87) PCT Pub. No.: WO2023/279465
PCT Pub. Date: Jan. 12, 2023

(65) Prior Publication Data
US 2024/0057445 A1 Feb. 15, 2024

(30) Foreign Application Priority Data
Jul. 9, 2021 (CN) .......................... 202110776715.6

(51) Int. Cl.
*H10K 59/80* (2023.01)
*H10K 59/65* (2023.01)
*H10K 77/10* (2023.01)

(52) U.S. Cl.
CPC ........... *H10K 59/873* (2023.02); *H10K 59/65* (2023.02); *H10K 77/10* (2023.02)

(58) Field of Classification Search
CPC ....... H10K 59/873; H10K 59/65; H10K 77/10
See application file for complete search history.

(56) References Cited

U.S. PATENT DOCUMENTS

2019/0137805 A1 5/2019 Huang
2020/0403180 A1* 12/2020 Seon .................... H10K 50/844
(Continued)

FOREIGN PATENT DOCUMENTS

CN 109728194 A 5/2019
CN 109802053 A 5/2019
(Continued)

*Primary Examiner* — David Vu
*Assistant Examiner* — Brandon C Fox

(57) ABSTRACT

An irregularly-shaped display panel and a display device are disclosed. The irregularly-shaped display panel includes an encapsulation area arranged around an opening and an irregularly-shaped display area arranged around the encapsulation area. A plurality of undercut structures in the encapsulation area are spaced apart from each other. The undercut structures include at least one first undercut structure and at least one second undercut structure. The first undercut structure includes a continuous first undercut groove, and the second undercut structure includes a plurality of second undercut grooves separated from each other and a partition part located between the second undercut grooves.

18 Claims, 6 Drawing Sheets

(56) References Cited

U.S. PATENT DOCUMENTS

| | | | |
|---|---|---|---|
| 2021/0126060 A1* | 4/2021 | Koo | H10K 59/121 |
| 2022/0165985 A1* | 5/2022 | Sung | H10K 50/844 |
| 2023/0147236 A1* | 5/2023 | Sun | H10K 59/1201 |
| | | | 257/40 |

FOREIGN PATENT DOCUMENTS

| | | | |
|---|---|---|---|
| CN | 110137373 A | | 8/2019 |
| CN | 110211998 A | | 9/2019 |
| CN | 110634928 A | * | 12/2019 |
| CN | 110690264 A | | 1/2020 |
| CN | 110783388 A | | 2/2020 |
| CN | 111276630 A | | 6/2020 |
| CN | 111403621 A | | 7/2020 |

* cited by examiner

IRREGULARLY-SHAPED DISPLAY PANEL AND DISPLAY DEVICE

FIELD OF INVENTION

The present disclosure relates to the field of display technology, and more particularly, to an irregularly-shaped display panel and a display device.

BACKGROUND OF INVENTION

Organic light-emitting diodes (OLED) display panels are favored by a great number of consumers and developers due to numerous advantages, such as self-illumination, high contrast, wide viewing angles, low power consumption, bendability, and thinness, and gradually occupy the market.

In order to enhance a screen-to-body ratio of an OLED display panel, forming an opening or groove on the OLED display panel to dispose optical elements, such as a camera in the opening or groove is adopted in the prior art. Because the OLED display panel is quite sensitive to water and oxygen, an undercut structure may be provided in an encapsulation area near the opening or groove to prevent the invasion of externa water and oxygen. However, during the actual application, when the OLED display panel is an irregularly-shaped display panel with the opening, the researchers found that after subjecting to the temperature and humidity in the environment (e.g., high temperature and high humidity), the problem of peeling or breaking may occur in film layers on the undercut structure since an undercut groove of the undercut structure of the irregularly-shaped display panel has a long extension distance, resulting in encapsulation failure and reduction of the reliability of the OLED display panel.

SUMMARY OF INVENTION

Technical Problem

The embodiments of the present application provide an irregularly-shaped display panel and a display device, which can improve the problems of encapsulation failure and reduction of product reliability caused by a long extension distance of an undercut groove in the prior art.

Technical Solutions

In a first aspect, the embodiment of the present application provides an irregularly-shaped display panel, an opening is defined on the irregularly-shaped display panel, and the irregularly-shaped display panel includes an encapsulation area arranged around the opening and an irregularly-shaped display area arranged around the encapsulation area. The irregularly-shaped display panel further includes a plurality of undercut structures located in the encapsulation area and arranged around the opening, and the undercut structures are spaced apart from each other. The plurality of undercut structures include at least one first undercut structure and at least one second undercut structure, the first undercut structure includes a continuous first undercut groove, the second undercut structure includes a plurality of second undercut grooves separated from each other and a partition part located between adjacent two of the second undercut grooves, and one of the at least one first undercut structure is arranged adjacent to the irregularly-shaped display area.

Optionally, a plurality of second undercut structures are arranged in the encapsulation area, and the partition parts of adjacent two of the second undercut structures are in a staggered arrangement.

Optionally, all of the partition parts of the second undercut structures are in a staggered arrangement.

Optionally, a plurality of first undercut structures are arranged in the encapsulation area, and the first undercut structures and the second undercut structures are spaced apart.

Optionally, a plurality of first undercut structures are arranged in the encapsulation area, and at least one of the first undercut structures is arranged between the second undercut structures.

Optionally, a blocking wall is arranged in the encapsulation area, at least one of the first undercut structures is arranged near a side of the blocking wall close to the irregularly-shaped display area, and at least one of the first undercut structures is arranged near a side of the blocking wall away from the irregularly-shaped display area.

Optionally, the second undercut structures are arranged near the side of the blocking wall away from the irregularly-shaped display area, and at least one of the first undercut structures is arranged between the second undercut structures arranged near the side of the blocking wall away from the irregularly-shaped display area and the blocking wall.

Optionally, at least one of the first undercut structures is arranged between the second undercut structures arranged near the side of the blocking wall away from the irregularly-shaped display area.

Optionally, at least one of the second undercut structures is arranged near the side of the blocking wall close to the irregularly-shaped display area.

Optionally, the irregularly-shaped display area includes a first irregularly-shaped boundary extending along a first direction and two second irregularly-shaped boundaries extending along a second direction, and the two second irregularly-shaped boundaries are located at two ends of the first irregularly-shaped boundary, a length of the first irregularly-shaped boundary is greater than a length of the second irregularly-shaped boundary. The partition parts are arranged opposite the first irregularly-shaped boundary.

Optionally, each of the second undercut structures includes at least two partition parts.

In a second aspect, the embodiment of the present application further provides a display device, the display device includes an optical element and an irregularly-shaped display panel, an opening is defined on the irregularly-shaped display panel, the optical element is arranged in the opening, and the irregularly-shaped display panel includes an encapsulation area arranged around the opening and an irregularly-shaped display area arranged around the encapsulation area. The irregularly-shaped display panel further includes a plurality of undercut structures located in the encapsulation area and arranged around the opening, and the plurality of undercut structures are spaced apart from each other, The plurality of undercut structures include at least one first undercut structure and at least one second undercut structure, the first undercut structure includes a continuous first undercut groove, the second undercut structure includes a plurality of second undercut grooves separated from each other and a partition part located between adjacent two of the second undercut grooves, and one of the at least one first undercut structure is arranged adjacent to the irregularly-shaped display area.

Optionally, a plurality of second undercut structures are arranged in the encapsulation area, and the partition parts of adjacent two of the second undercut structures are in a staggered arrangement.

Optionally, all of the partition parts of the second undercut structures are in a staggered arrangement.

Optionally, a plurality of first undercut structures are arranged in the encapsulation area, and the first undercut structures and the second undercut structures are spaced apart.

Optionally, a plurality of first undercut structures are arranged in the encapsulation area, and at least one of the first undercut structures is arranged between the second undercut structures.

Optionally, a blocking wall is arranged in the encapsulation area, at least one of the first undercut structures is arranged near a side of the blocking wall close to the irregularly-shaped display area, and at least one of the first undercut structures is arranged near a side of the blocking wall away from the irregularly-shaped display area.

Optionally, the second undercut structures are arranged near the side of the blocking wall away from the irregularly-shaped display area, and at least one of the first undercut structures is arranged between the second undercut structures arranged near the side of the blocking wall away from the irregularly-shaped display area and the blocking wall.

Optionally, at least one of the first undercut structures is arranged between the second undercut structures arranged near the side of the blocking wall away from the irregularly-shaped display area.

Optionally, at least one of the second undercut structures is arranged near the side of the blocking wall close to the irregularly-shaped display area.

Optionally, the irregularly-shaped display area includes a first irregularly-shaped boundary extending along a first direction and two second irregularly-shaped boundaries extending along a second direction, and the two second irregularly-shaped boundaries are located at two ends of the first irregularly-shaped boundary, a length of the first irregularly-shaped boundary is greater than a length of the second irregularly-shaped boundary. The partition parts are arranged opposite the first irregularly-shaped boundary.

Beneficial Effects

The irregularly-shaped display panel and the display device provided by the present application may ensure the encapsulation effect, and improve the problem of peeling and breaking of the film layer on the undercut structure caused by the long extension distance of the undercut groove as well.

DESCRIPTION OF DRAWINGS

To describe the technical solutions in the implementations of the present application or in the existing technologies more clearly, the following briefly describes the accompanying drawings for describing the implementations or the existing technologies. Apparently, the accompanying drawings in the following description merely show some implementations of the present application, and a person of ordinary skill in the art can still derive other drawings based on these drawings without creative efforts.

DETAILED DESCRIPTION OF PREFERRED EMBODIMENTS

In order to make the purpose, technical solution and effect of the present disclosure clearer and more definite, the present disclosure is further described in detail with reference to the attached drawings and embodiments. It should be understood that the specific embodiments described herein are only used to explain the present disclosure and the present disclosure is not limited thereto.

To simplify the disclosure of the implementations of the present application, description of the components and arrangements of specific examples is given below. Of course, they are only illustrative and not intended to limit the present application. Moreover, in the present application, reference numbers and/or letters may be repeated in different implementations. Such repetition is for the purposes of simplification and clearness, and does not denote the relationship between respective implementations and/or arrangements being discussed. In addition, the present disclosure provides various examples for specific process and materials. However, it is obvious for a person of ordinary skill in the art that other process and/or materials may alternatively be utilized. The embodiment of the present application provides an irregularly-shaped display panel. Detailed descriptions are given below. It should be noted that the order of description in the following embodiments is not meant to limit the preferred order of the embodiments.

Embodiment 1

The embodiment 1 of the present application discloses an irregularly-shaped display panel, an opening is defined on the irregularly-shaped display panel, and the irregularly-shaped display panel further includes a plurality of undercut structures located in the encapsulation area and arranged around the opening, and the undercut structures are spaced apart from each other. The plurality of undercut structures include at least one first undercut structure and at least one second undercut structure, the first undercut structure includes a continuous first undercut groove, the second undercut structure includes a plurality of second undercut grooves separated from each other and a partition part located between adjacent two of the second undercut grooves, and one of the at least one first undercut structure is arranged adjacent to the irregularly-shaped display area.

Figure 1:
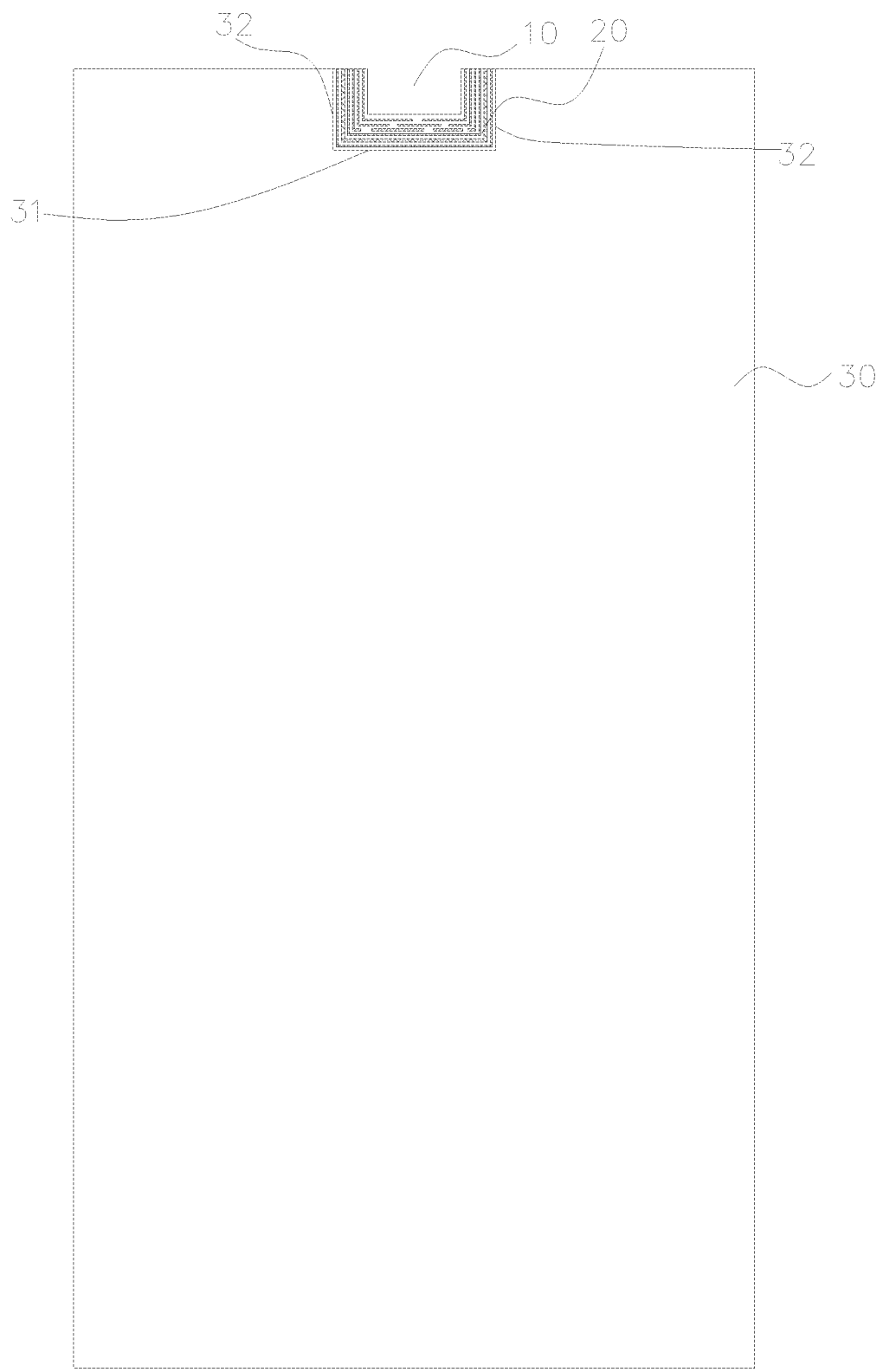
FIG. 1 is a schematic structural diagram of an irregularly-shaped display panel.

FIG. 1 is a schematic structural diagram of an irregularly-shaped display panel. As shown in FIG. 1, an opening 10 is defined on the irregularly-shaped display panel. The opening 10 is configured to be provided with components such as a camera, a light sensor, and a speaker, so that the areas of the irregularly-shaped display panel on the left and right sides of the opening 10 can display pictures normally, thereby achieving the effect of reducing the bezel area and increasing the screen-to-body ratio.

In the present embodiment, the irregularly-shaped display panel may be an organic light-emitting diode (OLED) display panel. The light-emitting unit of the OLED display panel uses an electroluminescent material, and the electroluminescent material is quite sensitive to water and oxygen. Therefore, in order to prevent external water and oxygen from entering into the irregularly-shaped display panel through the opening 10, the irregularly-shaped display panel further includes an encapsulation area 20 arranged around the opening 10 and an irregularly-shaped display area 30 arranged around the encapsulation area 20. A plurality of OLED pixel units are arranged in the irregularly-shaped display area 30 in an array, and each of the OLED pixel unit includes a light-emitting layer formed of the organic electroluminescent material. The encapsulation area 20 is configured to block the intrusion of external water and oxygen into the irregularly-shaped display area 30, so as to ensure the normal display of the OLED pixel units. It should be noted that the present embodiment only shows the encapsulation area 20 arranged around the opening 10, but the encapsulation area of the irregularly-shaped display panel may also be arranged in the periphery of the boundary of the irregularly-shaped display areas 30 except the area surrounding the opening 10. Moreover, the present embodiment does not limit the type of the light-emitting unit of the irregularly-shaped display panel, as long as there is a requirement to provide an encapsulation area 20 around the opening 10 for the irregularly-shaped display panel. For example, the light-emitting unit may be a mini light-emitting diode (Mini-LED) display panel, a micro light-emitting diode (Micro-LED) display panel, and a liquid crystal display (LCD) panel.

Figure 2:
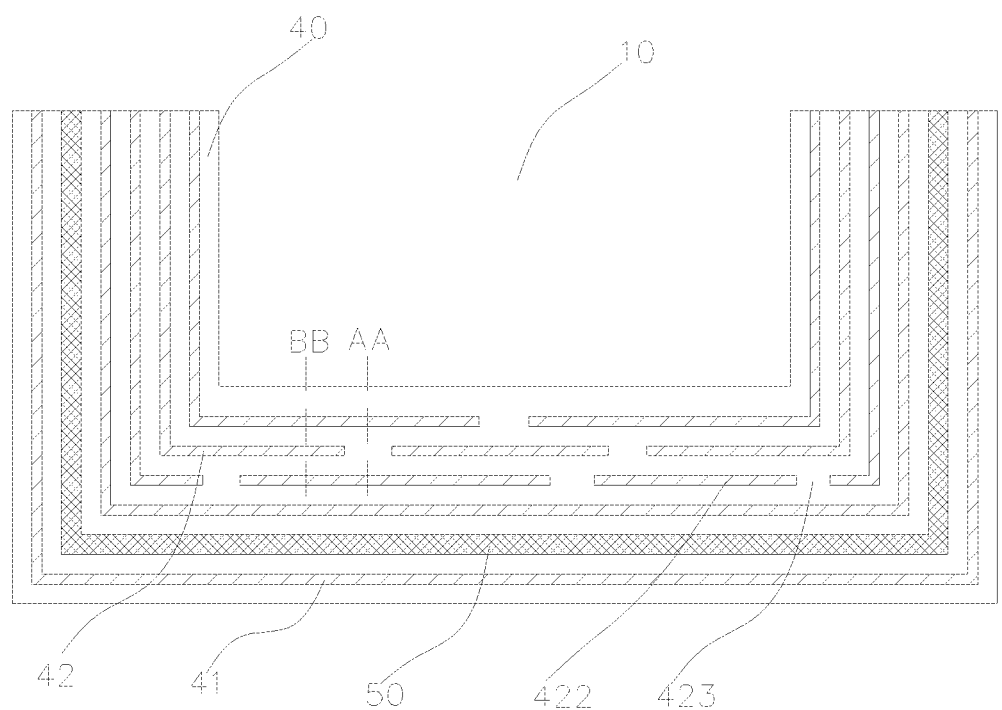
FIG. 2 is a schematic diagram of the undercut structure in the encapsulation area disclosed in an embodiment of the present application.

The specific structure of the encapsulation area 20 will be further explained below. FIG. 2 is a schematic diagram of the undercut structure in the encapsulation area disclosed in an embodiment of the present application. As shown in FIG. 1 and FIG. 2, the irregularly-shaped display panel further includes a plurality of undercut structures located in the encapsulation area 20 and arranged around the opening 10, and the plurality of undercut structures are spaced apart from each other. Each of the undercut structures is configured to separate the organic layer 40 in the encapsulation area 20, and the organic layer 40 is formed in the same process as the light-emitting layer in the irregularly-shaped display area 30, for example. The effect of the encapsulation area 20 to block the intrusion of water and oxygen from the outside can be enhanced by arranging a plurality of undercut structures spaced apart from each other in the encapsulation area 20, and the encapsulation effect of the irregularly-shaped display panel can be ensured.

Figure 3A:
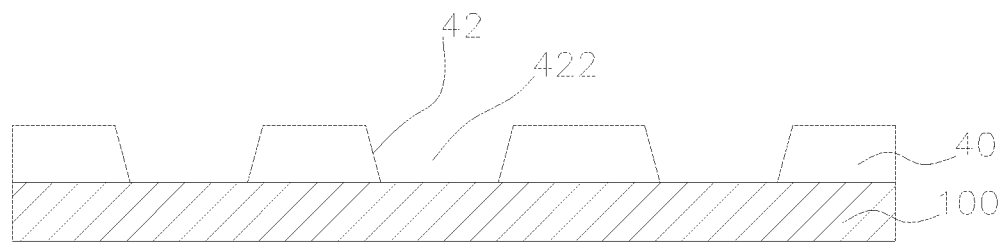
FIG. 3a is a schematic cross-sectional view of a plurality of second undercut structures in FIG. 2 along line AA.
Figure 3B:
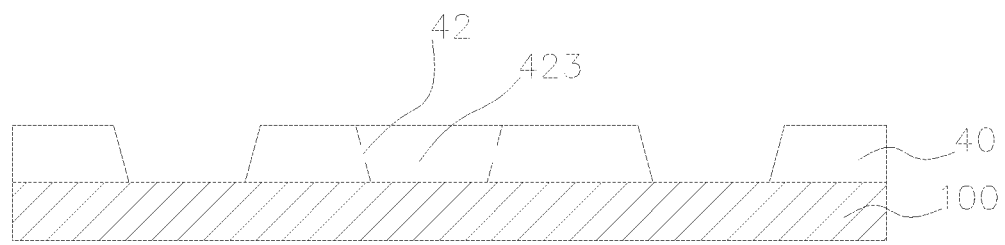
FIG. 3b is a schematic cross-sectional view of a plurality of second undercut structures in FIG. 2 along line BB.

FIG. 3a is a schematic cross-sectional view of the plurality of second undercut structures in FIG. 2 along line AA, and FIG. 3b is a schematic cross-sectional view of the plurality of second undercut structures in FIG. 2 along line BB. As shown in FIG. 1 to 3b, the plurality of undercut structures include at least one first undercut structure 41 and at least one second undercut structure 42, the first undercut structure 41 includes a continuous first undercut groove, and the second undercut structure 42 includes a plurality of second undercut grooves 422 separated from each other and a partition part 423 located between adjacent two of the second undercut grooves 422.

The first undercut structure 41 and the second undercut structure 42 are manufactured by patterning the organic layer 40 on the array substrate 100 in the encapsulation area 20. Specifically, the first undercut structure 41 and the second undercut structure 42 can be formed in the same photomask process, the first undercut groove and the second undercut groove 422 are both the groove structures formed by etching the organic layer 40 in the encapsulation area 20, and the partition part 423 is the remaining part of the organic layer 40 between adjacent two of the second undercut grooves 422 without etching. In the embodiment of the present application, part of the undercut structure of the plurality of undercut structures is configured as an undercut structure including the partition portion 423, so that extension distance of the undercut groove of the part of the undercut structure can be shortened while ensuring the encapsulation effect, and the problem of peeling and breaking of the film layer on the undercut structure caused by the long extension distance of the undercut groove can be improved.

Figure 4:
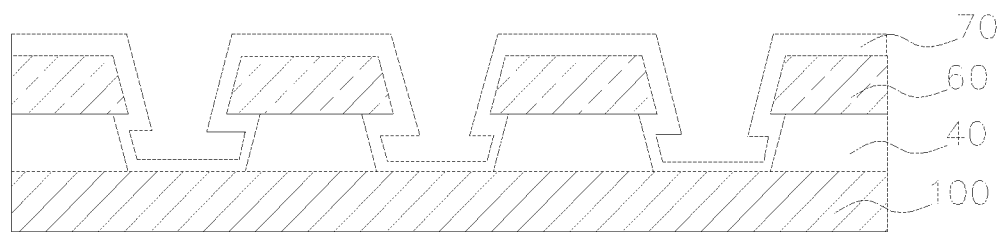
FIG. 4 is a schematic structural diagram of the film layer on the undercut structure.
Figure 5A:
FIG. 5a-5e is a schematic view of the manufacturing process of forming an undercut structure on an array substrate.
Figure 5B:
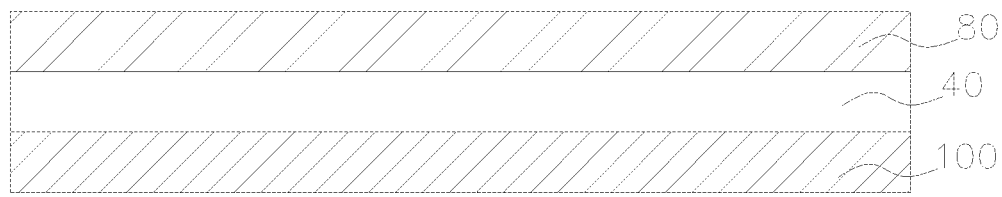
Figure 5C:
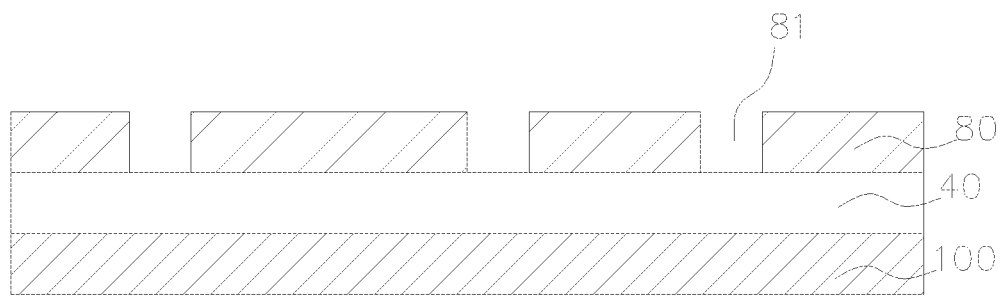
Figure 5D:
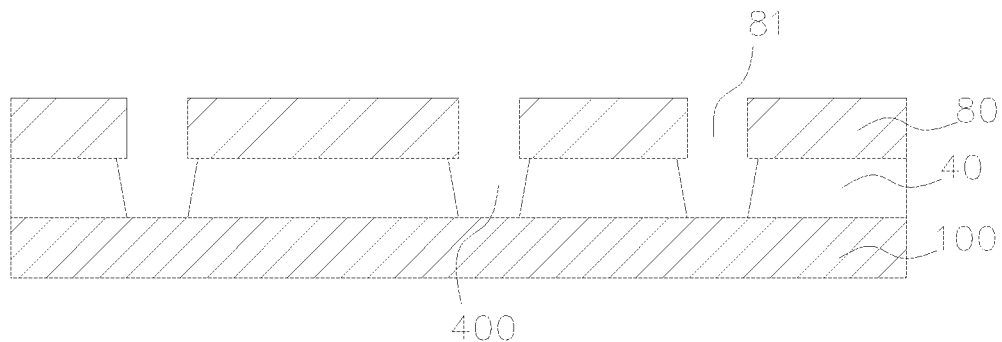
Figure 5E:
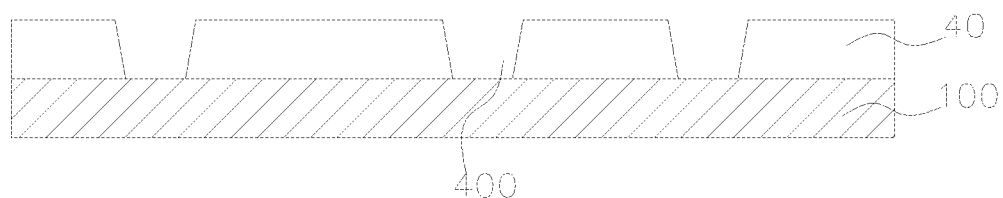

FIG. 4 is a schematic structural diagram of the film layer on the undercut structure. As shown in FIG. 4, in the present embodiment, the undercut structure is arranged on the array substrate 100. The array substrate 100 includes a glass substrate and a film layer structure disposed on the glass substrate, and the film layer structure may include driving circuit layer. Specifically, an organic layer 40, a first inorganic layer 60, and a second inorganic layer 70 are stacked on the array substrate 100 in the encapsulation area 20, and the undercut structure is formed in the organic layer 40 on the array substrate 100. The light-emitting layer in the irregularly-shaped display area 30 and the plurality of undercut structures in the organic layer 40 may be manufactured by a chemical vapor deposition (CVD) process to continuous form the films, which has advantages such as saving manufacturing processes and reducing costs.

FIG. 5a-5e are schematic views of the manufacturing process of forming an undercut structure on an array substrate. As shown in FIG. 5a-5e, the undercut structure formed on the array substrate 100 is formed by patterning the organic layer 40 on the array substrate 100, the steps include:

Step 1: An organic layer 40 is formed on the array substrate 100.

The organic layer 40 is located in the encapsulation area 20 and the irregularly-shaped display area 30, and the organic layer 40 is configured as a light-emitting layer in the irregularly-shaped display area 30 as well.

Step 2: A protective layer 80 is continuously deposited on the organic layer 40.

The protective layer 80 covers the encapsulation area 20 and the irregularly-shaped display area 30, and the protective layer 80 is configured to protect the organic layer 40 in the irregularly-shaped display area 30. The material of the protective layer 80 may be an inorganic material or metallic material.

Step 3: A photomask is utilized to expose a photoresist (not shown in the figure) coated on the protective layer 80 to light, so as to form a protective layer pattern 81 on the protective layer 80 in the encapsulation area 20 corresponding to the a plurality of undercut structures.

The photoresist is an organic photoresist, and the material of the organic photoresist may be a silicon photoresist or an acrylic photoresist. The protective layer pattern 81 formed on the protective layer 80 corresponding to the plurality of undercut structures includes a first protective layer pattern and a second protective layer pattern. The first protective layer pattern is a continuous first groove. The second protective layer pattern includes a plurality of second grooves separated from each other and a second protective layer connecting portion between the second grooves.

Step 4: The organic layer 40 is etched to form a plurality of undercut grooves 400 in the encapsulation area 20.

The process of etching is, for example, a dry etching process.

Step 5: The remaining photoresist and the protective layer 80 on the organic layer 40 are cleaned to obtain the plurality of undercut grooves 400.

The undercut grooves 400 and the non-etched organic layer 40 form the first undercut structure and the second undercut structure.

In the present embodiment, one of the at least one first undercut structure 41 is arranged adjacent to the irregularly-shaped display area 30, thereby ensuring that the undercut structure closest to the irregularly-shaped display area 30 is not the second undercut structure 42, in order to avoid increasing the risk of encapsulation failure caused by the direct contact between the second undercut structure 42 provided with the partition part 423 and the irregularly-shaped display area 30.

In the present embodiment, a plurality of second undercut structures 42 are located in the encapsulation area 20, and the partition parts of adjacent two of the second undercut structures 42 are in a staggered arrangement, so that a minimum separation distance between the partition parts 423 of adjacent two of the second undercut structures 42 can be controlled. The problem of peeling and breaking of the film layer on the undercut structure caused by the long extension distance of the undercut groove can be improved, while the encapsulation effect is enhanced. Preferably, all of the partition parts 423 of the second undercut structures 42 are in a staggered arrangement, that is, any one of the partition parts is arranged in a staggered arrangement with another partition parts.

In the present embodiment, the number of partition parts 423 of each of the second undercut structures 42 may be the same or different. Preferably, the number of partition parts 423 of the second undercut structure 42 is proportional to the minimum separation distance from the opening 10, that is, the farther the second undercut structure 42 is from the opening 10, the greater the number of the partition parts 423 included in the second undercut structure 42.

In the present embodiment, each of the second undercut structures 42 includes at least one partition part 423 and at least two second undercut grooves 422 partitioned by the at least one partition part 423. Preferably, each of the second undercut structures 42 includes at least two partition parts 423 and at least three second undercut grooves 422 partitioned by the at least two partition parts 423, and the separation distance between adjacent two of the second undercut grooves 422 of each one of the second undercut structures 42 is between 1 μm and 100 μm.

In the present embodiment, a plurality of first undercut structures are arranged in the encapsulation area, and the first undercut structures and the second undercut structures are spaced apart.

Continue to refer to FIG. 1-FIG. 2. In the present embodiment, the irregularly-shaped display area 30 includes a first irregularly-shaped boundary 31 extending along a first direction and two second irregularly-shaped boundaries 32 extending along a second direction, and the two second irregularly-shaped boundaries 32 are located at two ends of the first irregularly-shaped boundary 31, a length of the first irregularly-shaped boundary 31 is greater than a length of the second irregularly-shaped boundary 32. The partition parts 423 are arranged opposite the first irregularly-shaped boundary 31. Due to the relatively long length of the first irregularly-shaped boundary 31, the problem of peeling and breaking of the film layer on the undercut structure is more likely to occur when the partition part 423 is not provided in the undercut structure. Due to the relatively short length of the second irregularly-shaped boundary 32, even if the partition part 423 is not provided in the undercut structure, the problem of peeling and breaking of the film layer on the undercut structure is less likely to occur. Therefore, the partition parts 423 are arranged opposite the first irregularly-shaped boundary 31 in the embodiment of the present application, but this embodiment does not limit the position of the partition parts 423. In other embodiments of the present application, the partition parts 423 may also be arranged opposite the second irregularly-shaped boundary 32. Preferably, the first irregularly-shaped boundary 31 and the second irregularly-shaped boundary 32 are perpendicular to each other.

In the present embodiment, the irregularly-shaped display panel further includes a blocking wall 50 arranged in the encapsulation area 20, and the blocking wall 50 is specifically a protrusion disposed on the organic layer 40. The protrusion disposed on the organic layer 40 may be a protrusion directly disposed on the surface of the organic layer 40, or a protrusion disposed on the surface of the first inorganic layer 60 located on the organic layer 40, or a protrusion disposed on the surface of the second inorganic layer 70 located on the organic layer 40 and the first inorganic layer 60. Since the blocking wall 50 is provided in the encapsulation area 20, the encapsulation effect of the encapsulation area 20 can be further improved. It should be noted that the blocking wall 50 may not only be provided in the encapsulation area 20 surrounding the opening 10, but may also be located at the periphery of other boundaries outside the irregularly-shaped boundary of the irregularly-shaped display panel.

In the present embodiment, a plurality of first undercut structures 41 are arranged in the encapsulation area 20, at least one of the first undercut structures 41 is arranged near a side of the blocking wall 50 close to the irregularly-shaped display area 30, and at least another one of the first undercut structures 41 is arranged near a side of the blocking wall 50 away from the irregularly-shaped display area 30. Since at least one of the first undercut structures 41 is arranged near the side of the blocking wall 50 close to the irregularly-shaped display area 30 and at least another one of the first undercut structures 41 is arranged near the side away from the irregularly-shaped display area 30 respectively, and the first undercut structure 41 includes a continuous undercut groove. Therefore, it can be ensured that the external water or oxygen has to cross a barrier of at least one complete undercut structure before reaching the blocking wall 50, and even if a quite small amount of external water and oxygen may cross the blocking wall 50, the extremely small amount of external water and oxygen may also be blocked by the at least one of the first undercut structures 41 arranged near the side of the blocking wall 50 close to the irregularly-shaped display area 30, thereby further enhancing the encapsulation effect of the encapsulation area 20.

In the present embodiment, the second undercut structures 42 are arranged near the side of the blocking wall 50 away from the irregularly-shaped display area 30, and at least one of the first undercut structures 41 is arranged between the second undercut structures 42 near the side of the blocking wall 50 away from the irregularly-shaped display area 30 and the blocking wall 50, so as to ensure that even if the extremely small amount of external water and oxygen may cross the second undercut structures 42, it may also be blocked by the at least one of the first undercut structure 41 with a stronger encapsulation effect, thereby further enhancing the encapsulation effect of the encapsulation area 20.

Preferably, one of the first undercut structures 41 and three of the second undercut structures 42 are arranged near the side of the blocking wall 50 away from the irregularly-shaped display area 30, and the one of the first undercut structures 41 is located between the three of the second undercut structures 42 and the blocking wall 50.

Figure 6:
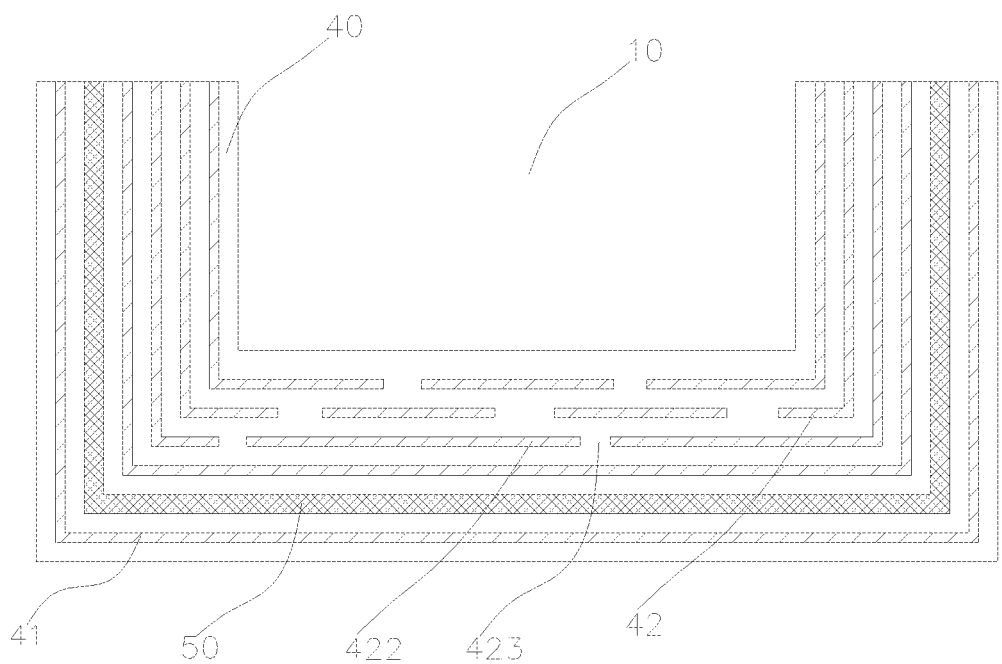
FIG. 6 is a schematic diagram of the undercut structure in the encapsulation area disclosed in an embodiment of the present application.
Figure 7:
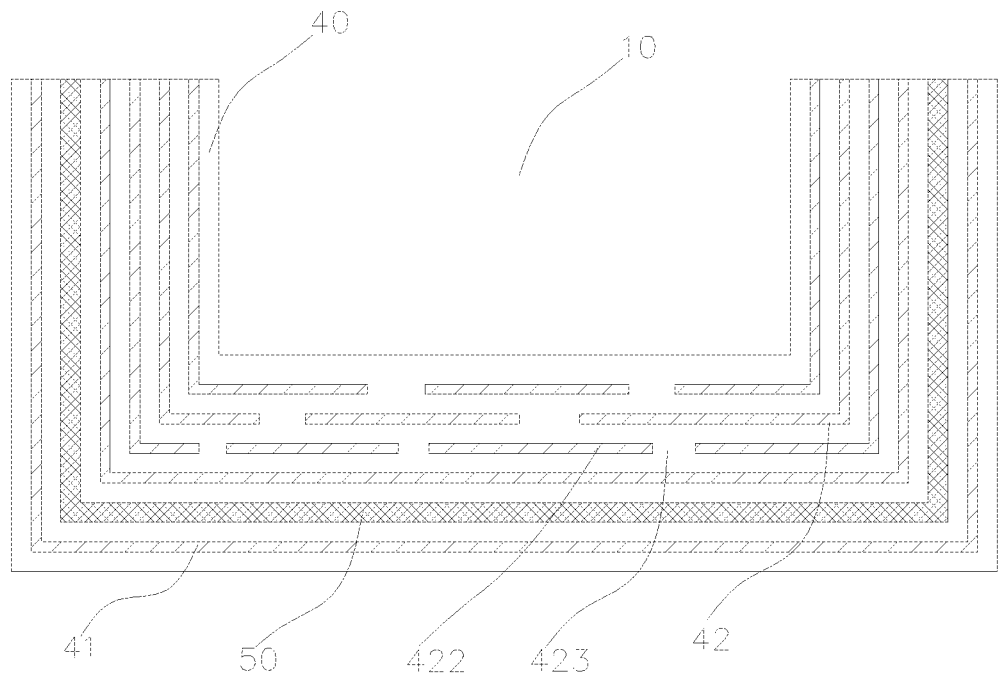
FIG. 7 is a schematic diagram of the undercut structure in the encapsulation area disclosed in an embodiment of the present application.

FIGS. 6 and 7 are schematic diagrams of the undercut structure in the encapsulation area 20 disclosed in an embodiment of the present application. As shown in FIGS. 6 and 7, the undercut structure in the encapsulation area in other embodiments of the present application is similar to the undercut structure illustrated in FIG. 2, except that the number of the partition parts 423 of the second undercut structure 42 and the separation distance between adjacent two of the second undercut grooves 422 of the second undercut structure 42 are different from the second undercut structure 42 shown in FIG. 2.

In the present embodiment, one of the first undercut structures 41 is arranged near the side of the blocking wall 50 close to the irregularly-shaped display area 30, and none of the second undercut structure 42 is provided, so as to ensure the encapsulation effect as much as possible while the width of the encapsulation area 20 and the bezel area are reduced, so as to enhance the screen-to-body ratio of the irregularly-shaped display panel.

Embodiment 2

Figure 8:
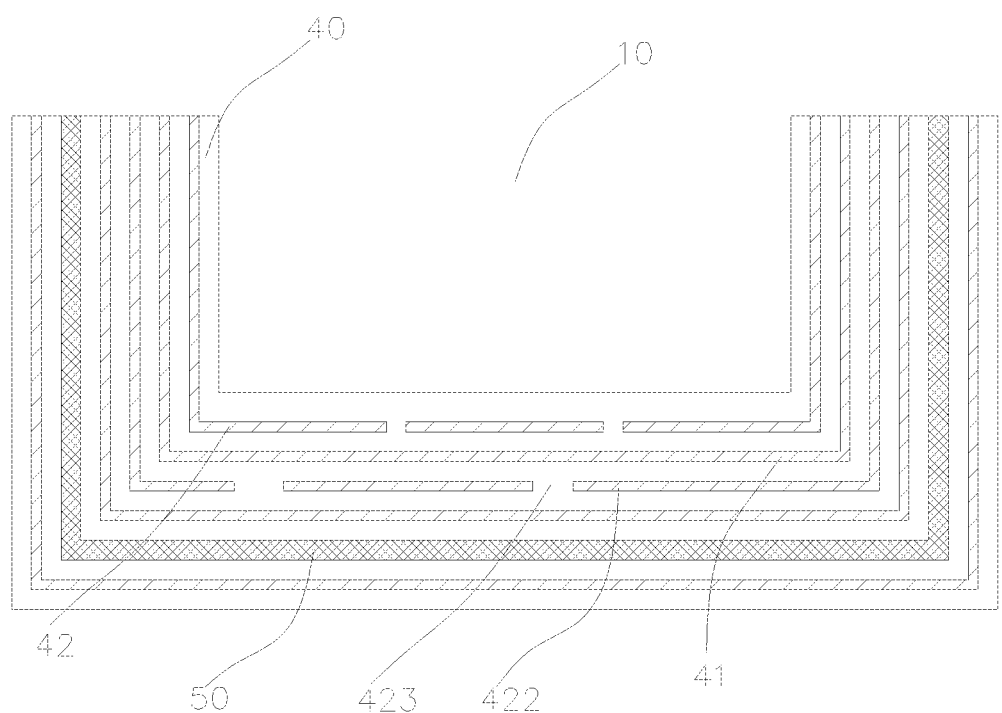
FIG. 8 is a schematic diagram of the undercut structure in the encapsulation area disclosed in an embodiment of the present application.

FIG. 8 is a schematic diagram of the undercut structure in the encapsulation area disclosed in an embodiment of the present application. As shown in FIG. 8, the embodiment 2 of the present application discloses an irregularly-shaped display panel, the structure of the irregularly-shaped display panel is similar to the structure of the above-mentioned embodiment 1, and the identical features will not be redundantly described. In the present embodiment. The difference is that a plurality of first undercut structures 41 are arranged in the encapsulation area, and at least one of the first undercut structures 41 is disposed between the second undercut structures 42. Specifically, the plurality of first undercut structures 41 and second undercut structures 42 are arranged near the side of the blocking wall 50 away from the irregularly-shaped display area 30, at least one of the first undercut structures 41 is arranged between the second undercut structures 42 near the side of the blocking wall 50 away from the irregularly-shaped display area 30 and the blocking wall 50, and at least another one of the first undercut structures 41 is arranged between the second undercut structures 42 near the side of the blocking wall 50 away from the irregularly-shaped display area 30. In the embodiment of the present application, since at least one of the first undercut structures 41 is arranged between the second undercut structures 42, further decreasing the possibility of the external water and oxygen from crossing the second undercut structures 42 near the side of the blocking wall 50 away from the irregularly-shaped display area 30, so as to further enhance the encapsulation effect of the encapsulation area 20.

Preferably, two of the first undercut structures 41 and two of the second undercut structures 42 are arranged near the side of the blocking wall 50 away from the irregularly-shaped display area 30, one of the first undercut structures 41 is located between the two of the second undercut structures 42 and the blocking wall 50, and the other one of the first undercut structures 41 is located between the two of the second undercut structures 42.

Embodiment 3

Figure 9:
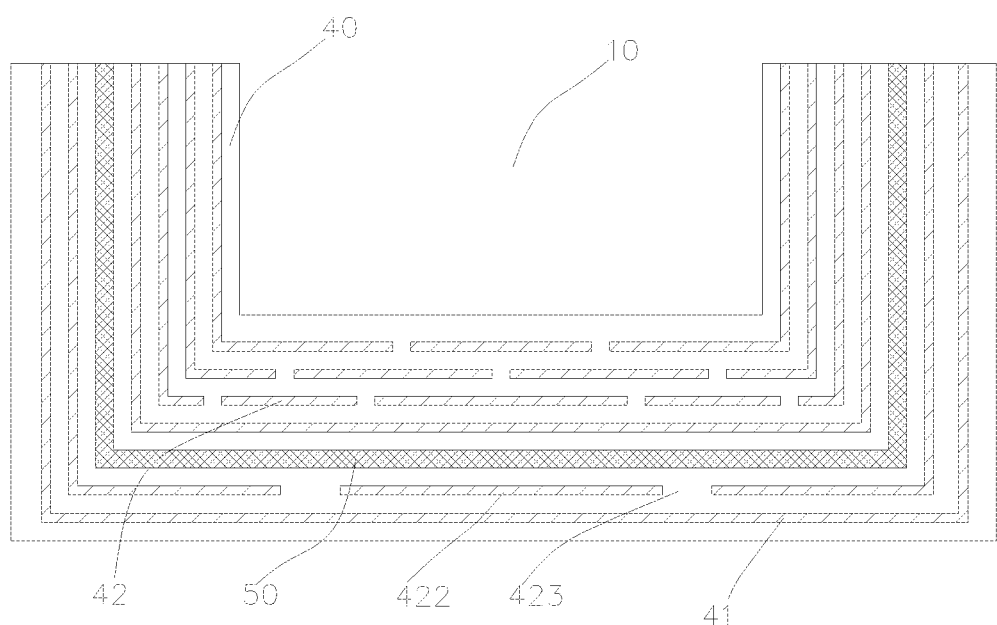
FIG. 9 is a schematic diagram of the undercut structure in the encapsulation area disclosed in an embodiment of the present application.

FIG. 9 is a schematic diagram of the undercut structure in the encapsulation area disclosed in an embodiment of the present application. As shown in FIG. 9, the embodiment 3 of the present application discloses an irregularly-shaped display panel, the structure of the irregularly-shaped display panel is similar to the structure of the above-mentioned embodiment 1, and the identical features will not be redundantly described. In the present embodiment. The difference is that a plurality of first undercut structures 41 are arranged in the encapsulation area 20, and at least one of the first undercut structures 41 is disposed between the second undercut structures 42. Specifically, at least one of the second undercut structures 42 is arranged near the side of the blocking wall 50 close to the irregularly-shaped display area 30, and one of the first undercut structures 41 adjacent to the irregularly-shaped display area 30 is arranged near the side of the blocking wall 50 close to the irregularly-shaped display area 30. That is, the at least one of the first undercut structures 41 is disposed between the at least one of the second undercut structures 42 arranged near the side of the blocking wall 50 close to the irregularly-shaped display area 30 and the irregularly-shaped display area 30, so as to further enhance the encapsulation effect of the encapsulation area 20.

Preferably, one of the first undercut structures 41 and one of the second undercut structures 42 are arranged near the side of the blocking wall 50 close to the irregularly-shaped display area 30, and the one of the first undercut structures 41 is located between the one of second undercut structures 42 and the irregularly-shaped display area 30.

Embodiment 4

The embodiment 4 of the present application discloses a display device, and the display device includes an optical element and an irregularly-shaped display panel as described in any of the above embodiments. An opening is defined on the irregularly-shaped display panel, and the optical element is arranged in the opening, the optical element may include at least one of a camera and an optical sensor. However, the embodiments of the present application do not limit the types of components provided in the opening, and electronic components such as earpieces, speakers, etc. can also be provided in the opening.

In summary, the embodiments of the present application disclose an irregularly-shaped display panel and a display device, and an opening is defined on the irregularly-shaped display panel. The irregularly-shaped display panel includes an encapsulation area arranged around the opening and an irregularly-shaped display area arranged around the encapsulation area. The irregularly-shaped display panel further includes a plurality of undercut structures located in the encapsulation area and arranged around the opening, and the undercut structures are spaced apart from each other. The plurality of undercut structures include at least one first undercut structure and at least one second undercut structure, the first undercut structure includes a continuous first undercut groove, the second undercut structure includes a plurality of second undercut grooves separated from each other and a partition part located between adjacent two of the second undercut grooves, and one of the at least one first undercut structure is arranged adjacent to the irregularly-shaped display area. The irregularly-shaped display panel and the display device provided by the present application may ensure the encapsulation effect, and improve the problem of peeling and breaking of the film layer on the undercut structure caused by the long extension distance of the undercut groove as well.

The above is a detailed introduction to an irregularly-shaped display panel and a display device provided by the embodiments of the present application. Specific examples are used in this article to explain the principles and implementations of the present application. The description of the above embodiments is only used to help understand the method of application and its core idea; at the same time, for those skilled in the art, according to the idea of this application, there will be changes in the specific implementation and the scope of application. In summary, the content of this specification should not be understood as restrictions on this application.

What is claimed is:

1. An irregularly-shaped display panel, wherein an opening is defined on the irregularly-shaped display panel, and the irregularly-shaped display panel comprises an encapsulation area arranged around the opening and an irregularly-shaped display area arranged around the encapsulation area;
    wherein the irregularly-shaped display panel further comprises a plurality of undercut structures located in the encapsulation area and arranged around the opening, and the undercut structures are spaced apart from each other;
    wherein the plurality of undercut structures comprise at least one first undercut structure and at least one second undercut structure, the first undercut structure comprises a continuous first undercut groove, the second undercut structure comprises a plurality of second undercut grooves separated from each other and a partition part located between adjacent two of the second undercut grooves, and one of the at least one first undercut structure is arranged adjacent to the irregularly-shaped display area; and
    wherein a plurality of second undercut structures are arranged in the encapsulation area, wherein the partition parts of adjacent two of the second undercut structures are in a staggered arrangement.

2. The irregularly-shaped display panel according to claim 1, wherein all of the partition parts of the second undercut structures are in a staggered arrangement.

3. The irregularly-shaped display panel according to claim 1, wherein a plurality of first undercut structures are arranged in the encapsulation area, and the first undercut structures and the second undercut structures are spaced apart.

4. The irregularly-shaped display panel according to claim 1, wherein a plurality of first undercut structures are arranged in the encapsulation area, and at least one of the first undercut structures is arranged between the second undercut structures.

5. The irregularly-shaped display panel according to claim 4, wherein a blocking wall is arranged in the encapsulation area, at least one of the first undercut structures is arranged near a side of the blocking wall close to the irregularly-shaped display area, and at least one of the first undercut structures is arranged near a side of the blocking wall away from the irregularly-shaped display area.

6. The irregularly-shaped display panel according to claim 5, wherein the second undercut structures are arranged near the side of the blocking wall away from the irregularly-shaped display area, wherein at least one of the first undercut structures is arranged between the second undercut structures arranged near the side of the blocking wall away from the irregularly-shaped display area and the blocking wall.

7. The irregularly-shaped display panel according to claim 6, wherein at least one of the first undercut structures is arranged between the second undercut structures arranged near the side of the blocking wall away from the irregularly-shaped display area.

8. The irregularly-shaped display panel according to claim 6, wherein at least one of the second undercut structures is arranged near the side of the blocking wall close to the irregularly-shaped display area.

9. The irregularly-shaped display panel according to claim 1, wherein the irregularly-shaped display area comprises a first irregularly-shaped boundary extending along a first direction and two second irregularly-shaped boundaries extending along a second direction, and the two second irregularly-shaped boundaries are located at two ends of the first irregularly-shaped boundary, a length of the first irregularly-shaped boundary is greater than a length of the second irregularly-shaped boundary, wherein the partition parts are arranged opposite the first irregularly-shaped boundary.

10. A display device, wherein the display device comprises an optical element and an irregularly-shaped display panel, an opening is defined on the irregularly-shaped display panel, the optical element is arranged in the opening, and the irregularly-shaped display panel comprises an encapsulation area arranged around the opening and an irregularly-shaped display area arranged around the encapsulation area;
    wherein the irregularly-shaped display panel further comprises a plurality of undercut structures located in the encapsulation area and arranged around the opening, and the plurality of undercut structures are spaced apart from each other;
    wherein the plurality of undercut structures comprise at least one first undercut structure and at least one second undercut structure, the first undercut structure comprises a continuous first undercut groove, and the second undercut structure comprises a plurality of second undercut grooves separated from each other and a partition part located between adjacent two of the second undercut grooves, and one of the at least one first undercut structure is arranged adjacent to the irregularly-shaped display area; and
    wherein a plurality of second undercut structures are arranged in the encapsulation area, wherein the partition parts of adjacent two of the second undercut structures are in a staggered arrangement.

11. The display device according to claim 10, wherein all of the partition parts of the second undercut structures are in a staggered arrangement.

12. The display device according to claim 10, wherein a plurality of first undercut structures are arranged in the encapsulation area, and the first undercut structures and the second undercut structures are spaced apart.

13. The display device according to claim 10, wherein a plurality of first undercut structures are arranged in the encapsulation area, at least one of the first undercut structures is arranged between the second undercut structures.

14. The display device according to claim 12, wherein a blocking wall is arranged in the encapsulation area, at least one of the first undercut structures is arranged near a side of the blocking wall close to the irregularly-shaped display area, and at least one of the first undercut structures is arranged near a side of the blocking wall away from the irregularly-shaped display area.

15. The display device according to claim 14, wherein the second undercut structures are arranged near the side of the blocking wall away from the irregularly-shaped display area, wherein at least one of the first undercut structures is arranged between the second undercut structures arranged near the side of the blocking wall away from the irregularly-shaped display area and the blocking wall.

16. The display device according to claim 15, wherein at least one of the first undercut structures is arranged between the second undercut structures arranged near the side of the blocking wall away from the irregularly-shaped display area.

17. The display device according to claim 15, wherein at least one of the second undercut structures is arranged near the side of the blocking wall close to the irregularly-shaped display area.

18. The display device according to claim 10, wherein the irregularly-shaped display area comprises a first irregularly-shaped boundary extending along a first direction and two second irregularly-shaped boundaries extending along a second direction, and the two second irregularly-shaped boundaries are located at two ends of the first irregularly-shaped boundary, a length of the first irregularly-shaped boundary is greater than a length of the second irregularly-shaped boundary, wherein the partition parts are disposed opposite the first irregularly-shaped boundary.

* * * * *